US006777288B1

United States Patent
Padmanabhan et al.

(10) Patent No.: US 6,777,288 B1
(45) Date of Patent: Aug. 17, 2004

(54) VERTICAL MOS TRANSISTOR

(75) Inventors: Gobi R. Padmanabhan, Sunnyvale, CA (US); Visvamohan Yegnashankaran, Redwood City, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/290,138

(22) Filed: Nov. 6, 2002

(51) Int. Cl.[7] .................. H01L 21/336; H01L 21/8242
(52) U.S. Cl. ................... 438/250; 438/253; 438/240; 438/244; 438/149
(58) Field of Search ................ 438/250–253, 438/240–244, 149, 272, 284, 212, 277, 283

(56) References Cited

U.S. PATENT DOCUMENTS

| | | | | |
|---|---|---|---|---|
| 4,750,023 A | * | 6/1988 | Shannon | 257/336 |
| 4,871,684 A | * | 10/1989 | Glang et al. | 438/322 |
| 5,073,519 A | * | 12/1991 | Rodder | 438/269 |
| 5,087,581 A | * | 2/1992 | Rodder | 438/268 |
| 5,170,243 A | * | 12/1992 | Dhong et al. | 365/208 |
| 5,504,359 A | * | 4/1996 | Rodder | 257/329 |
| 5,554,869 A | * | 9/1996 | Chang | 257/316 |
| 5,578,850 A | * | 11/1996 | Fitch et al. | 257/329 |
| 5,627,395 A | * | 5/1997 | Witek et al. | 257/350 |
| 5,825,609 A | * | 10/1998 | Andricacos et al. | 361/321.4 |
| 5,831,319 A | * | 11/1998 | Pan | 257/408 |
| 5,894,152 A | * | 4/1999 | Jaso et al. | 257/347 |
| 5,912,492 A | * | 6/1999 | Chang et al. | 257/344 |
| 5,914,851 A | * | 6/1999 | Saenger et al. | 361/311 |
| 5,963,800 A | * | 10/1999 | Augusto | 438/212 |
| 6,107,125 A | * | 8/2000 | Jaso et al. | 438/149 |
| 6,169,017 B1 | * | 1/2001 | Lee | 438/585 |
| 6,204,532 B1 | * | 3/2001 | Gambino et al. | 257/329 |
| 6,337,497 B1 | * | 1/2002 | Hanafi et al. | 257/306 |
| 6,440,801 B1 | * | 8/2002 | Furukawa et al. | 438/272 |
| 6,504,210 B1 | * | 1/2003 | Divakaruni et al. | 257/344 |
| 6,562,681 B2 | * | 5/2003 | Tuan et al. | 438/257 |
| 6,593,614 B1 | * | 7/2003 | Hofmann et al. | 257/306 |
| 6,642,586 B2 | * | 11/2003 | Takahashi | 257/390 |
| 6,656,825 B2 | * | 12/2003 | Burbach | 438/596 |

OTHER PUBLICATIONS

H. Pein and J. D. Plummer, "A 3–D sidewall flash EPROM call and memory array", Electron Device Letters, vol. 14 (8) 1993 pp. 415–417.*
H. Pein and J. D. Plummer, "Performance of the 3–D Pencil Flash EPROM Cell and Memory Array", IEEE Translations on Election Devices, vol. 42, No. 11, 1995, pp. 1982–1991.*

* cited by examiner

Primary Examiner—Michael Lebentritt
(74) Attorney, Agent, or Firm—Mark C. Pickering

(57) ABSTRACT

A vertical MOS transistor has a very short channel length that is indirectly defined by the thickness of a layer of semiconductor material or the depths of implants. The transistor has a first (source/drain) region formed in a substrate material, a semiconductor region formed on the first region, and a second (source/drain) region formed in the top surface of the semiconductor region. The distance between the first region and the second region defines the channel length of the transistor.

15 Claims, 15 Drawing Sheets

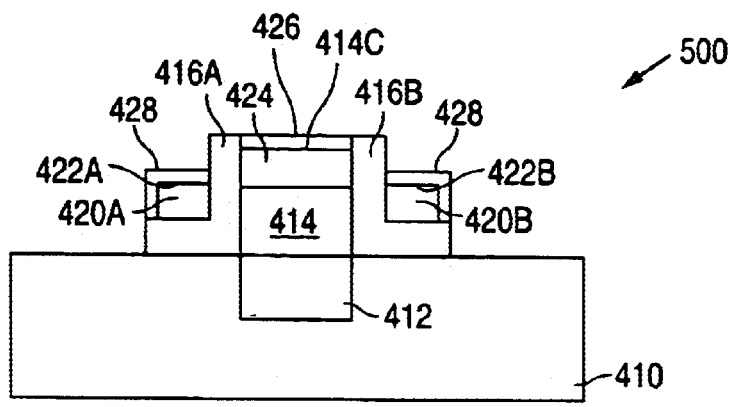
FIG. 5
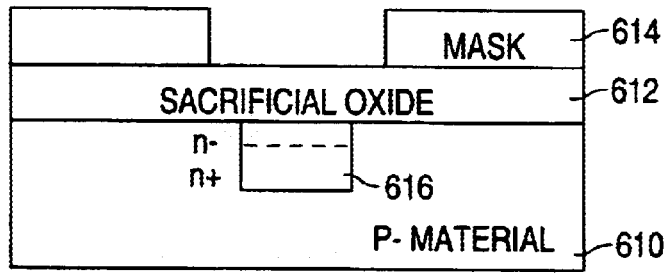
FIG. 6A1
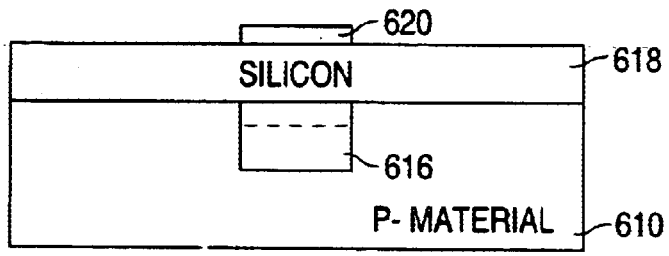
FIG. 6B1
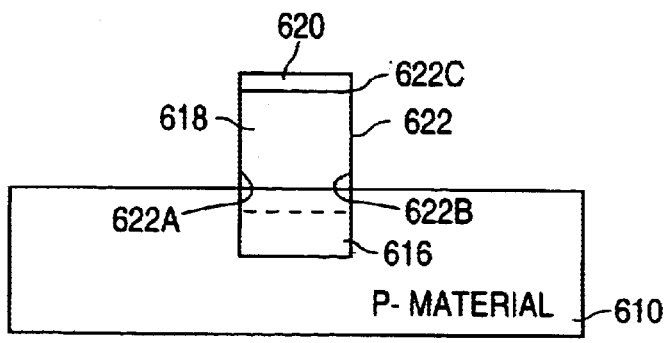
FIG. 6C1

VERTICAL MOS TRANSISTOR

BACKGROUND OF THE INVENTION

1. Field of the Invention

The present invention relates to a MOS transistor and, more particularly, to a vertical MOS transistor and a method of forming the transistor.

2. Description of the Related Art

A MOS transistor is a well-known element that is one of the fundamental building blocks of many electrical circuits. There are two basic types of MOS transistors, a p-channel or PMOS transistor and an n-channel or NMOS transistor. A PMOS transistor has p+ source and drain regions and a p-channel when conducting, while a NMOS transistor has n+ source and drain regions and an n-channel when conducting.

FIG. 1 shows a cross-sectional view that illustrates one example of a conventional NMOS transistor 100. As shown in FIG. 1, transistor 100, which is formed in a p-type semiconductor material 110, such as a substrate or well, has spaced-apart n+ source and drain regions 112 and 114 that are formed in material 110.

In addition, transistor 100 has a channel region 116 that is located between source and drain regions 112 and 114. Further, transistor 100 includes a layer of gate oxide 120 that is formed over channel region 116, and a polysilicon gate 122 that is formed on gate oxide layer 120 over channel region 116.

In operation, material 110 and source region 112 are often connected to ground when drain region 114 is connected to a positive voltage source, such as 1.2V. As long as the voltage on gate 122 remains below a threshold voltage, substantially no charge carriers flow from source region 112 to drain region 114 (a small leakage current may be present). However, when the voltage on gate 122 equals or exceeds the threshold voltage, transistor 100 turns on and electrons begin to flow from source region 112 to drain region 114.

FIG. 2 shows a cross-sectional view that illustrates a second example of a conventional NMOS transistor 200. NMOS transistor 200 is similar to NMOS transistor 100 and, as a result, utilizes the same reference numerals to designate the structures which are common to both transistors.

As shown in FIG. 2, transistor 200 differs from transistor 100 in that material 110 is surrounded by an isolation region 210. In addition, material 110 is not connected to an external bias, such as a substrate or well contact and, as a result, electrically floats. Further, transistor 200 operates the same as transistor 100.

One of the limitations of transistors 100 and 200 is that the channel lengths of transistors 100 and 200 (the shortest distance between source and drain regions 112 and 114 at the surface of material 110) are defined by the minimum photolithographic feature size that is provided by the semiconductor fabrication process.

FIGS. 3A–3C show cross-sectional views that illustrate a MOS structure 300 during a conventional MOS transistor fabrication process. As shown in FIG. 3A, MOS structure 300 has a p-type semiconductor material 310, such as a substrate or well, and a layer of gate oxide 312 that is formed over material 310.

In addition, MOS structure 300 has a layer of polysilicon 314 that is formed on gate oxide layer 312, and a mask 316 that is formed on a portion of polysilicon layer 314. As further shown in FIG. 3A, mask 316 has a length L1 that is equal to the minimum feature size provided by the fabrication process.

Following the formation of MOS structure 300 in FIG. 3A, structure 300 is anisotropically etched until the exposed regions of polysilicon layer 314 have been removed from the surface of gate oxide layer 312. As shown in FIG. 3B, the etch forms a gate 318 that has a gate length L2 that is defined by the length L1 of mask 316. Following this, mask 316 is removed.

Next, as shown in FIG. 3C, structure 300 is implanted with an n-type dopant to form source and drain regions 320 and 322. Source and drain regions 320 and 322 can be single heavily-doped n+ implanted regions, or can be lightly-doped n– LDD regions. As further shown in FIG. 3C, the implant defines a channel 324 that has a channel length L3 that is defined by the length L2 of gate 318. (Current-generation low temperature annealing and activating processes allow very little lateral diffusion of the dopants.)

As a result, the channel length L3 is defined by the length L1 of mask 316 which has the minimum photolithographic feature size that is provided by the fabrication process. Thus, there is a need for a MOS transistor and a method of forming the transistor that allow a channel length to be formed that is smaller than the minimum photolithographic feature size that is provided by the fabrication process.

SUMMARY OF THE INVENTION

The present invention provides a MOS transistor that can be formed to have a channel length that is defined by the thickness of a layer of material that is formed over the substrate. A MOS transistor in accordance with the present invention, which is formed in a semiconductor material of a first conductivity type, includes a first region of a second conductivity type that is formed in the semiconductor material. The MOS transistor also includes a semiconductor region of the first conductivity type that is formed on the semiconductor material over the first region. The semiconductor region has a first side wall, an opposite second side wall, and a top surface.

In addition, the MOS transistor includes a first insulator that is formed on the semiconductor material adjacent to the first side wall, and a second insulator that is formed on the semiconductor material adjacent to the second side wall. Further, the MOS transistor includes a first gate that is formed on the first insulator, and a second region of the second conductivity type that is formed in the top surface of the semiconductor region. The MOS transistor can also include a second gate that contacts the second insulator.

The present invention also includes a method of forming a MOS transistor in a semiconductor material of a first conductivity type. The method includes the steps of forming a first region of a second conductivity type in the semiconductor material, and forming a semiconductor region of the first conductivity type on the semiconductor material. The semiconductor region has a first side wall, an opposite second side wall, and a top surface.

The method also includes the steps of forming a layer of insulation material on the semiconductor material adjacent to the semiconductor region, and forming a layer of conductive material on the layer of insulation material. Further, the method includes the steps of removing the layer of conductive material that lies over the first region, and etching the layer of conductive material to form a first gate and a second gate on the layer of insulation material. The first and second gates are on opposite sides of the semiconductor region.

In the present method, the first region can have a substantially uniform dopant concentration, or a substantially non-uniform dopant concentration. The substantially non-uniform dopant concentration includes a surface region of a light dopant concentration, and a lower region of a heavy dopant concentration that lies below and contacts the surface region.

A better understanding of the features and advantages of the present invention will be obtained by reference to the following detailed description and accompanying drawings that set forth an illustrative embodiment in which the principles of the invention are utilized.

BRIEF DESCRIPTION OF THE DRAWINGS

FIG. 4A is a plan view, while FIG. 4B is a cross-sectional view taken along line 4B—4B of FIG. 4A.

FIG. 5 is a cross-sectional view illustrating a vertical MOS transistor 500 in accordance with an alternate embodiment of the present invention.

FIGS. 6A1–6O are a series of cross-sectional views illustrating a method of forming a vertical MOS transistor in accordance with the present invention.

DETAILED DESCRIPTION OF THE INVENTION

Figure 4A:
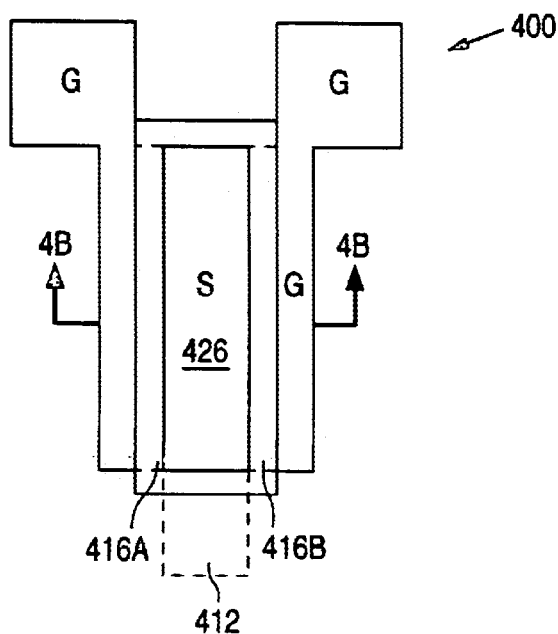
FIGS. 4A–4B are views illustrating an example of a vertical MOS transistor 400 in accordance with the present invention.
Figure 4B:
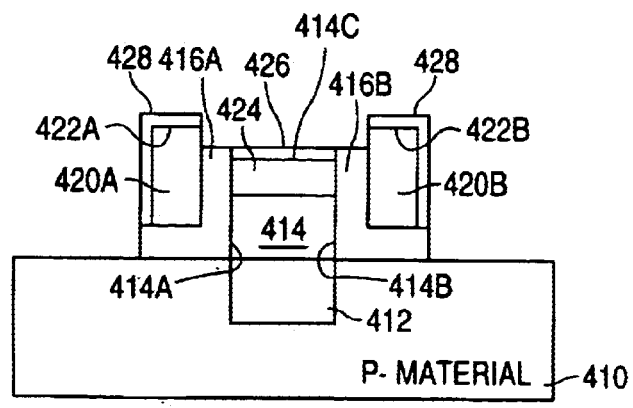

FIGS. 4A–4B show views that illustrate an example of a vertical MOS transistor 400 in accordance with the present invention. FIG. 4A shows a plan view, while FIG. 4B shows a cross-sectional view taken along line 4B—4B of FIG. 4A. As described in greater detail below, the channel length of transistor 400 is indirectly defined by the thickness of a layer of material or the depth of an implant and, as a result, can be formed to be very short.

In the example shown in FIGS. 4A–4B, transistor 400 is formed in a p-type material 410, such as a substrate or a well, and includes an n-type region 412 that is formed in material 410. Region 412, which can function as a source or a drain, can be a single heavily-doped n+ region, or can have a lightly-doped n− surface region (LDD) and a heavily-doped n+ lower region that contacts and is formed below the n− surface region.

In addition, transistor 400 also includes a semiconductor region 414 that is formed on material 410 over n-type region 412, and a pair of gate insulators 416A and 416B. Semiconductor region 414, which can be formed from, for example, amorphous silicon, single-crystal silicon, silicon germanium, and other similar materials, has a first side wall 414A, a second side wall 414B, and a top surface 414C.

Gate insulator 416A is formed on the surface of material 410 and on first side wall 414A of semiconductor region 414. Similarly, gate insulator 416B is formed on the surface of material 410 and on second side wall 414B of semiconductor region 414. Gate insulators 416A and 416B can be implemented with, for example, gate oxide, nitride, oxide-nitride combinations and other similar materials. (Gate insulators 416A and 416B are connected to gate insulators that are also formed on the two side walls that can not be seen in cross section.)

Further, transistor 400 also includes a pair of side gates 420A and 420B that are formed on insulators 416A and 416B, respectively. Side gates 420A and 420B have top surfaces 422 and 422B. Transistor 400 additionally includes an n-type region 424 that is formed in, and contacts top surface 414C of, semiconductor region 414.

Region 424, which can function as a source or a drain, can have a single heavily-doped n+ region, or a heavily-doped n+ surface region and a lightly doped n− lower region that contacts and is formed below the n+ surface region. In addition, transistor 400 can include a layer silicide 426 that is formed on n-type region 424, and a layer of silicide 428 that is formed on side gates 420A and 420B.

FIG. 5 shows a cross-sectional view that illustrates a vertical MOS transistor 500 in accordance with an alternate embodiment of the present invention. FIG. 5 can be taken along the line 4B—4B shown in FIG. 4A. MOS transistor 500 is similar to MOS transistor 400 and, as a result, utilizes the same reference numerals to designate the structures which are common to both transistors.

As shown in FIG. 5, transistor 500 differs from transistor 400 in that transistor 500 has side gates 420A and 420B with top surfaces 422A and 422B, respectively, that lie below top surface 414C of semiconductor region 414. Transistors 400 and 500 are electrically operated in the same way as conventional MOS transistors with a floating well such as transistor 200. Thus, since the n-type (source and drain) regions 412 and 424 of transistors 400 and 500 are vertically aligned, transistors 400 and 500 form vertical MOS transistors.

Figure 1:
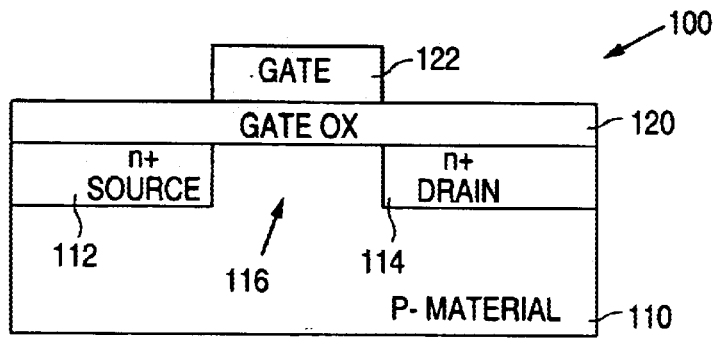
FIG. 1 is a cross-sectional view illustrating one example of a conventional NMOS transistor 100.

FIGS. 6A1–6O show a series of cross-sectional views that illustrate a method of forming a vertical MOS transistor in accordance with the present invention. As shown in FIG. 6A1, the method utilizes a layer of p− semiconductor material 610, such as a substrate or a well, and begins by forming a layer of sacrificial material 612, such as an oxide, on semiconductor material 610. Following this, a mask 614 is formed and patterned on sacrificial layer 612.

Next, the regions of semiconductor material 610 that lie below the exposed regions of sacrificial material 612 are implanted to form an n-type region 616. Region 616, which can function as either a source or a drain, can be formed as a single heavily-doped n+ region, or as a lightly-doped n− surface region that contacts a heavily-doped n+ lower region (as shown in FIG. 6A1). After this, mask 614 and sacrificial layer 612 are removed.

Once mask 614 and sacrificial layer 612 have been removed, as shown in FIG. 6B1, a layer of lightly-doped p-type semiconductor material 618, such as amorphous silicon, single crystal silicon, silicon germanium and other similar materials, is formed (e.g., epitaxially grown) on semiconductor material 610. Material 618 can be doped during formation, or after formation.

In accordance with the present invention, the thickness of semiconductor layer 618 indirectly defines the channel length of the to-be-formed MOS transistor. With current-generation semiconductor fabrication equipment, semiconductor layer 618 can be accurately formed to have a very small thickness that is less than the minimum channel length that can be photolithographically obtained with, for example, a 0.12-micron fabrication process.

In a 0.12-micron process, the minimum length that can be photolithographically obtained is approximately 0.12 microns which, in turn, is equal to $120 \times 10^{-9}$ meters. On the other hand, films of amorphous or polycrystalline silicon can be formed to be 900 Å thick, plus or minus 50 Å thick. This is equal to 0.09 microns, plus or minus 0.005 microns, which is also equal to $90 \times 10^{-9}$ meters, plus or minus $5 \times 10^{-9}$ meters. By utilizing the thickness of a film to indirectly determine the channel length, transistors with a channel length that is less than 0.10 microns ($100 \times 10-9$ meters or 1000 Å) can be formed.

Returning to FIG. 6B1, after semiconductor layer 618 has been formed, a layer of masking material is deposited and patterned to form a mask 620 on semiconductor layer 618. After this, as shown in FIG. 6C1, the exposed regions of semiconductor layer 618 are anisotropically etched until semiconductor layer 618 is removed from the top surface of semiconductor material 610. The etch forms a semiconductor region 622 that has a first side wall surface 622A, an opposing second side wall surface 622B, and a top surface 622C. Mask 620 is then removed.

Figure 2:
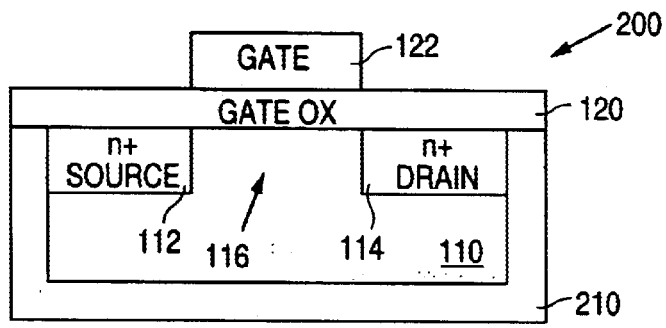
FIG. 2 is a cross-sectional view illustrating a second example of a conventional NMOS transistor 200.
Figure 3A:
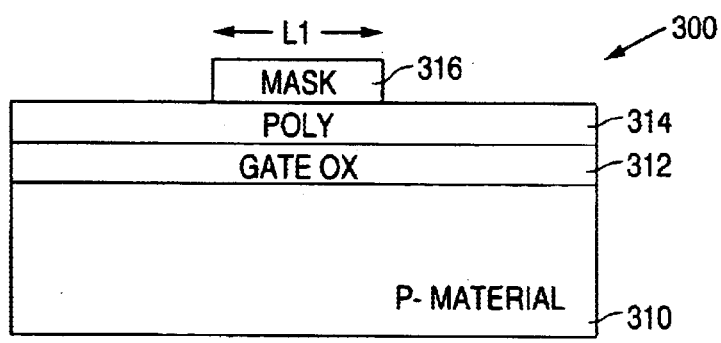
FIGS. 3A–3C are cross-sectional views illustrating a MOS structure 300 during a conventional MOS transistor fabrication process.
Figure 3B:
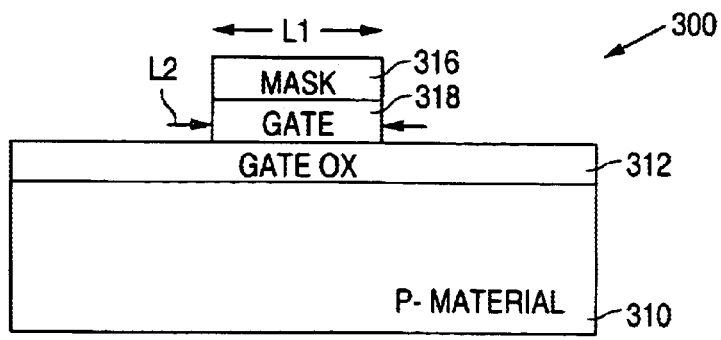
Figure 3C:
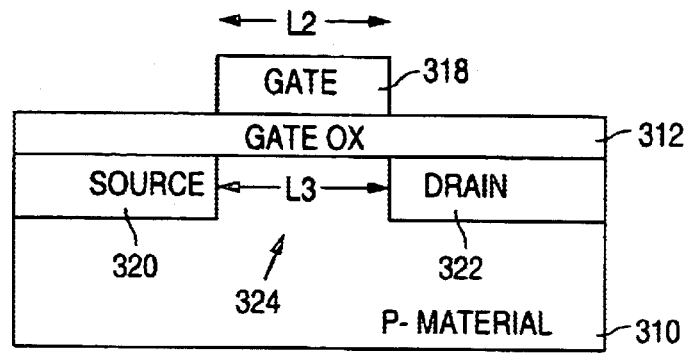

Alternately, as shown in FIGS. 6A2–6C2, the method begins by forming a layer of sacrificial material 612-A, such as an oxide, on semiconductor material 610. Following this, a mask 614-A is formed and patterned on sacrificial layer 612-A.

Next, the regions of semiconductor material 610 that lie below the exposed regions of sacrificial material 612-A are implanted to form an n-type region 616. As shown in FIG. 6A2, region 616 is formed well below the surface of p-type material 610. Region 616, which can function as either a source or a drain, can be formed as a single heavily-doped n+ region, or as a lightly-doped n− region that contacts a heavily-doped n+ lower region (as shown in FIG. 6A2). After this, mask 614-A and sacrificial layer 612-A are removed.

In accordance with the present invention, the depth of the implant indirectly defines the channel length of the to-be-formed MOS transistor. With current-generation semiconductor fabrication equipment, the depth can be accurately formed at a precise depth that is less than the minimum channel length that can be photolithographically obtained with, for example, a 0.12-micron fabrication process.

Once mask 614-A and sacrificial layer 612-A have been removed, as shown in FIG. 6B2, a layer of masking material is deposited and patterned to form a mask 620-A on semiconductor material 610. After this, as shown in FIG. 6C2, the exposed regions of semiconductor material 610 are anisotropically etched for a predetermined period of time. The etch forms semiconductor region 622 that has a first side wall surface 622A, an opposing second side wall surface 622B, and a top surface 622C. Mask 620-A is then removed.

Figure 6D:
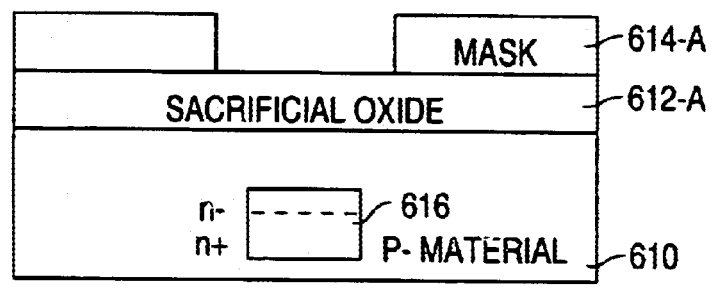
Figure 6D:
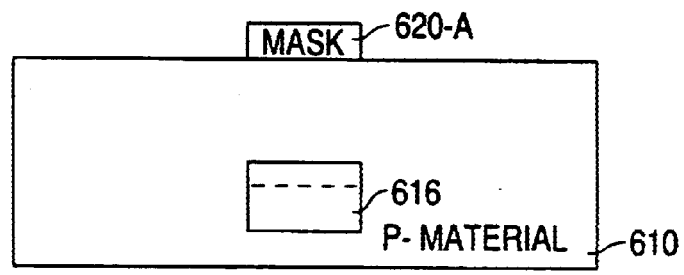
Figure 6D:
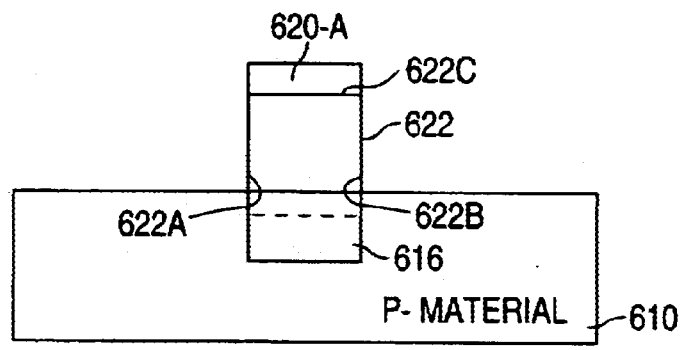
Figure 6D:
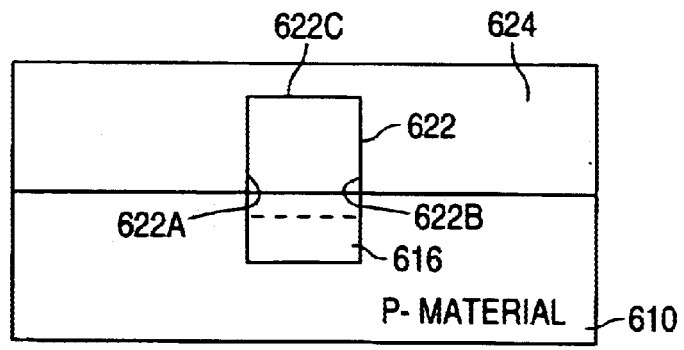
Figure 6E:
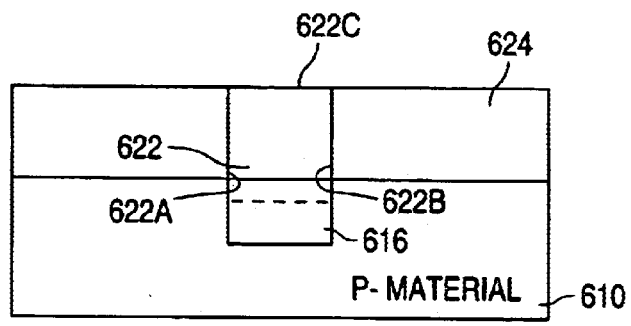

Next, regardless of whether region 622 was formed with mask 620 or 620-A, as shown in FIG. 6D, a layer of sacrificial material 624, such as oxide, is formed over semiconductor material 610 and semiconductor region 622. Following this, as shown in FIG. 6E, sacrificial layer 624 is planarized until sacrificial layer 624 has been removed from the top surface 622C of semiconductor region 622. Layer 624 can be planarized using, for example, chemical-mechanical polishing.

Figure 6F:
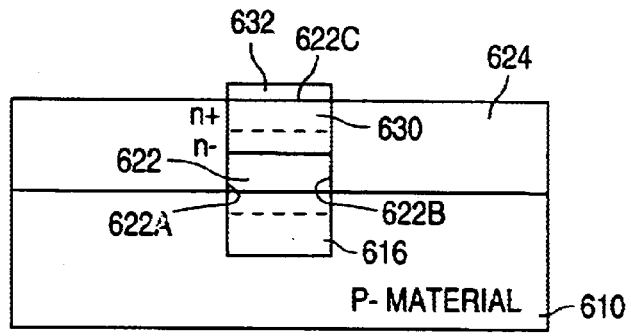

Following this, as shown in FIG. 6F, the top surface 622C of semiconductor region 622 is implanted with an n-type material to form an n-type region 630 in semiconductor region 622. Region 630, which can function as, for example, a source or a drain, can be formed as a single heavily-doped n+ region, or as a heavily-doped n+ surface region that contacts a lightly-doped n− lower region.

As noted above, with current-generation implanters, the depth of the dopant atoms within semiconductor region 622 can be precisely controlled. (As noted above, current processes allow very little diffusion of the dopants.) Thus, since the depth of implanted region 616 can be precisely controlled, and the depth of the dopant atoms in implanted region 630 can be precisely controlled, a vertical MOS transistor can be formed with a precisely controlled channel length. (The channel length is the distance between n-type region 616 and n-type region 630.) The precisely controlled channel length, in turn, can be smaller than the smallest channel length that can be photolithographically obtained with, for example, a 0.12-micron fabrication process.

In an alternate embodiment, n-type region 616 can be formed after the planarization step that removes sacrificial layer 624 from the top surface 622C of semiconductor region 622. In addition, n-type regions 616 and 630 can be formed sequentially by utilizing multiple implants with different implant energies.

After implanted region 630 has been formed, a layer of silicide 632 is formed on the top surface 622C of region 622. Silicide layer 632 can be formed using standard materials and methods. After silicide layer 632 has been formed, sacrificial layer 624 is removed from the surface of semiconductor material 610.

Figure 6G:
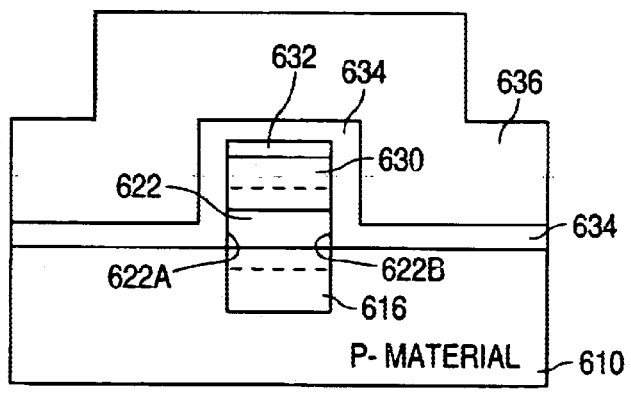
Figure 6H:
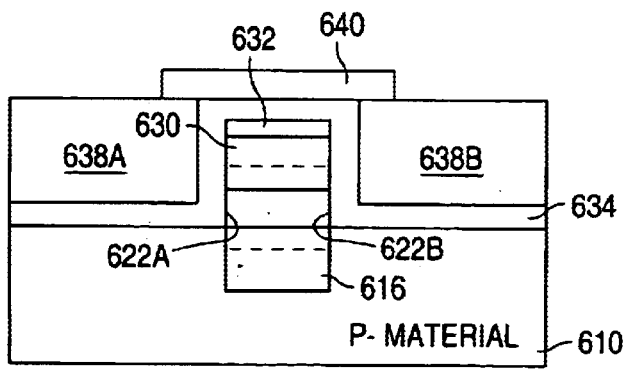

Next, as shown in FIG. 6G, a layer of dielectric material 634 is conformally formed on the top surface of semiconductor material 610, the side wall surfaces 622A–622B of semiconductor region 622 (dielectric material 634 is also formed on the two side walls that can not be seen in cross section), and silicide layer 632. Dielectric layer 634 can be implemented with gate oxide, nitride, oxide-nitride combinations, and other similar materials. Following this, a layer of conductive material 636, such as polysilicon, is formed on dielectric layer 634. When formed from polysilicon, layer 636 can be doped during or after formation.

After conductive layer 636 has been formed, as shown in 6H, conductive layer 636 is planarized until conductive layer 636 has been removed from the region of dielectric layer 634 that lies over the top surface 622C of semiconductor region 622. The planarization forms a first gate region 638A on dielectric layer 634, and a second gate region 638B on dielectric layer 634 on the other side of region 622. (As shown in FIG. 4A, the gates are electrically isolated, but can alternately be connected together.)

Figure 6I:
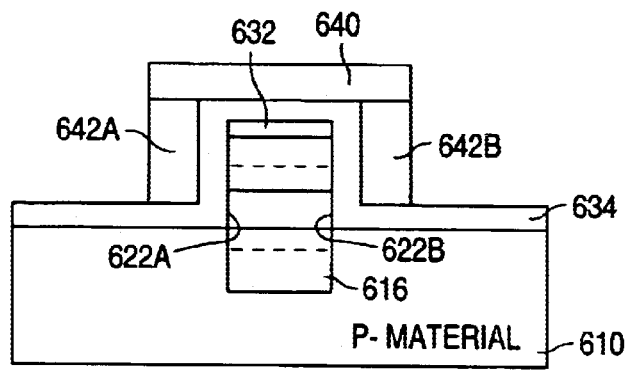

Next, a mask 640 is formed and patterned over n-type region 630, the vertical portions of dielectric layer 634, and adjacent portions of gate regions 638A and 638B. Following this, as shown in FIG. 6I, the exposed areas of gate regions 638A and 638B are removed to form side gates 642A and 642B. Mask 640 is then removed.

Figure 6J:
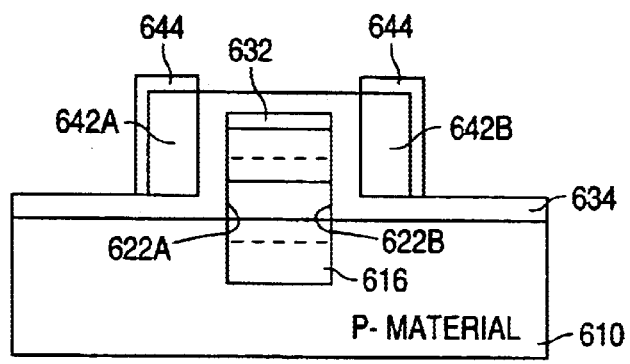
Figure 6K:
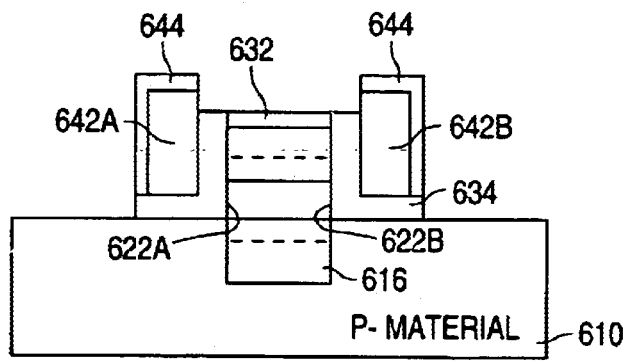

As shown in FIG. 6J, after mask 640 has been removed, a layer of silicide 644 is formed on the exposed portions of gate regions 642A and 642B. Following this, as shown in FIG. 6K, dielectric layer 634 is etched until dielectric layer 634 has been removed from the surface of silicide layer 632. The method then continues with conventional backend processing steps.

Figure 6L:
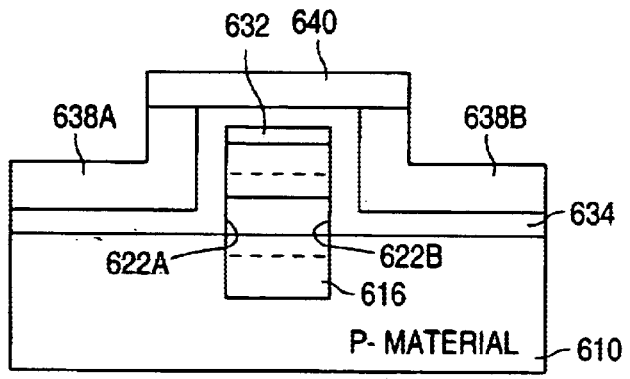
Figure 6M:
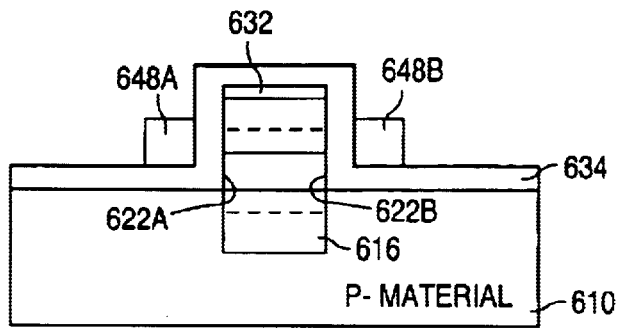

In another alternate embodiment, as shown in FIG. 6L, the exposed areas of gate regions 638A and 638B are partially removed after mask 640 has been formed. After this, mask 640 is removed. Next, as shown in FIG. 6M, gate regions 638A and 638B are further etched to form side gates 648A and 648B.

Figure 6N:
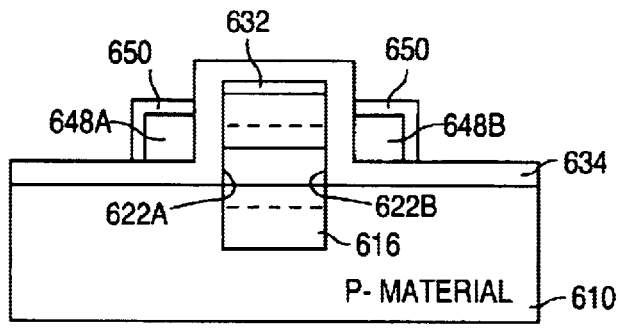
Figure 6O:
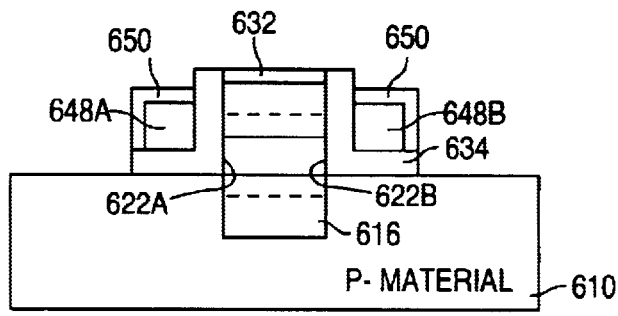

After this, as shown in FIG. 6N, a layer of silicide 650 is formed on the exposed portions of side gates 648A and 648B. Following this, as shown in FIG. 6O, dielectric layer 634 is etched until dielectric layer 634 has been removed from the surface of suicide layer 632. The method then continues with conventional backend processing steps.

Thus, the present invention provides a vertical MOS transistor that can be formed to have a very small channel length. The channel length can be formed to be smaller than a channel length that can be photolithographically obtained with, for example, a 0.12-micron semiconductor fabrication process.

Figure 7:
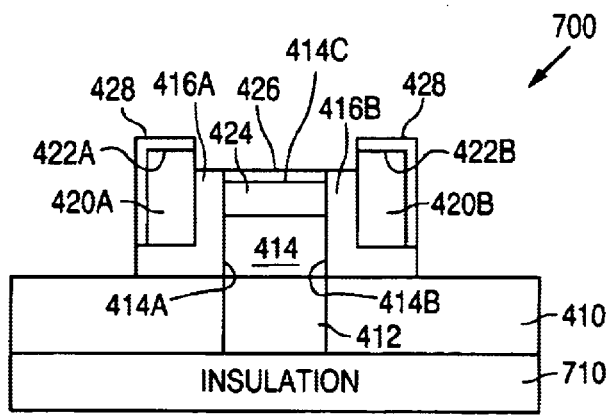
FIG. 7 is a cross-sectional view illustrating a vertical MOS transistor 700 in accordance with an alternate embodiment of the present invention.

FIG. 7 shows a cross-sectional view that illustrates a vertical MOS transistor 700 in accordance with an alternate embodiment of the present invention. FIG. 7 can be taken along the line 4B—4B shown in FIG. 4A. MOS transistor 700 is similar to MOS transistor 400 and, as a result, utilizes the same reference numerals to designate the structures which are common to both transistors.

As shown in FIG. 7, transistor 700 differs from transistor 400 in that material 410 of transistor 700 is formed on an insulation layer 710, such as the insulation layer of a silicon-on-insulator (SOI) material. Transistor 700 is electrically operated in the same way as transistor 400. Layer 710 isolates region 616 from other devices.

Figure 8:
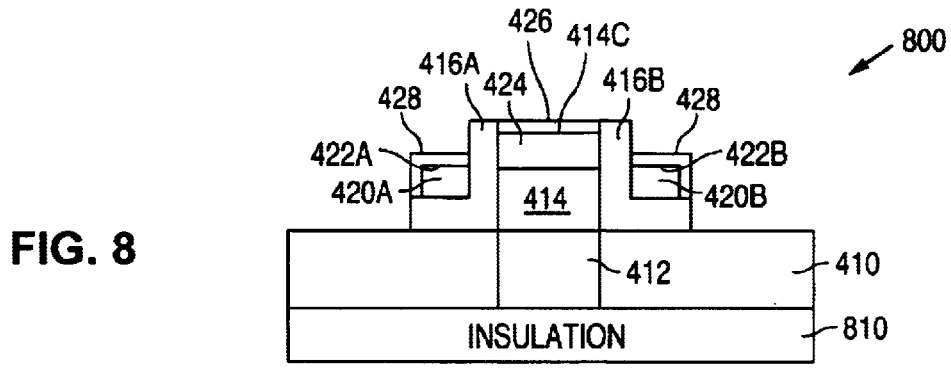
FIG. 8 is a cross-sectional view illustrating a vertical MOS transistor 800 in accordance with an alternate embodiment of the present invention.

FIG. 8 shows a cross-sectional view that illustrates a vertical MOS transistor 800 in accordance with an alternate embodiment of the present invention. FIG. 8 can be taken along the line 4B-4B shown in FIG. 4A. MOS transistor 800 is similar to MOS transistor 500 and, as a result, utilizes the same reference numerals to designate the structures which are common to both transistors.

As shown in FIG. 8, transistor 800 differs from transistor 500 in that transistor 800 is formed on an insulation layer 810, such as the insulation layer of a silicon-on-insulator (SOI) device. Transistor 800 is electrically operated in the same way as transistor 500. Layer 810 isolates region 616 from other devices.

Figure 9A:
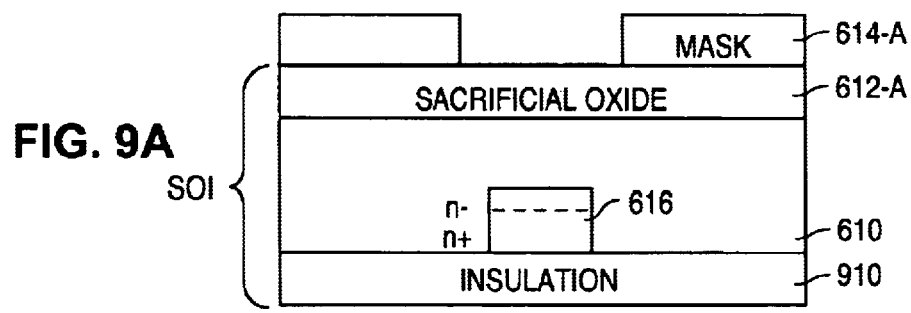
FIGS. 9A–9O are a series of cross-sectional views illustrating a method of forming a vertical MOS transistor in accordance with an alternate embodiment of the present invention.
Figure 9B:
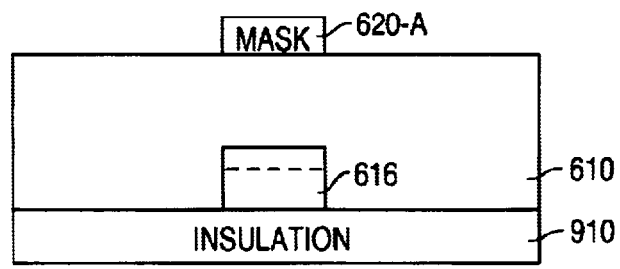
Figure 9C:
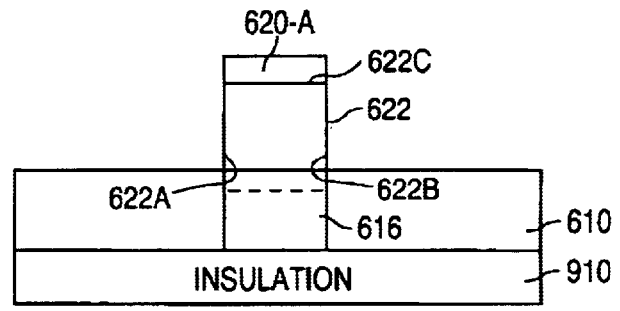
Figure 9D:
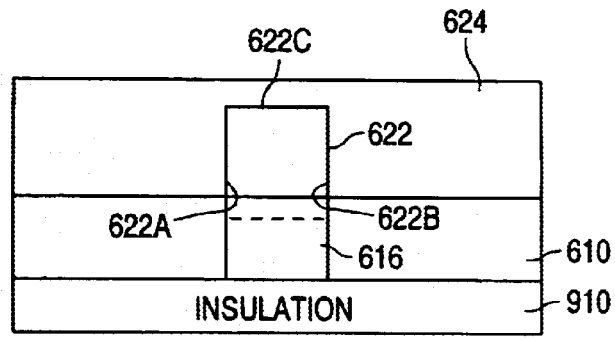
Figure 9E:
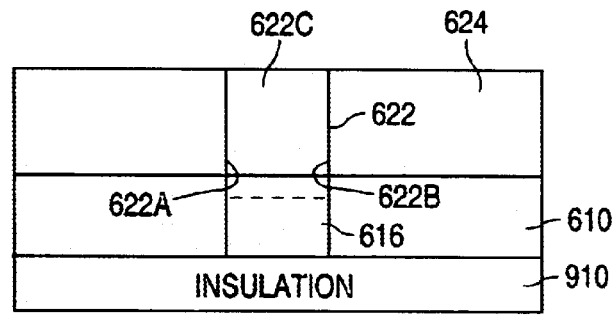
Figure 9F:
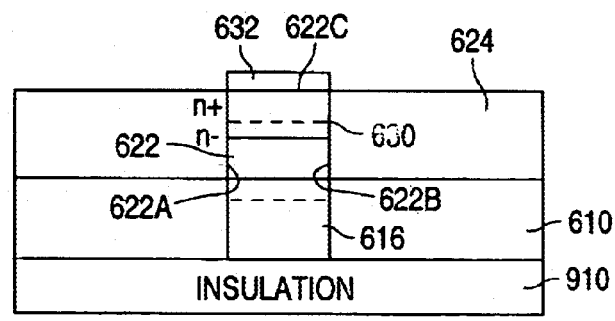
Figure 9G:
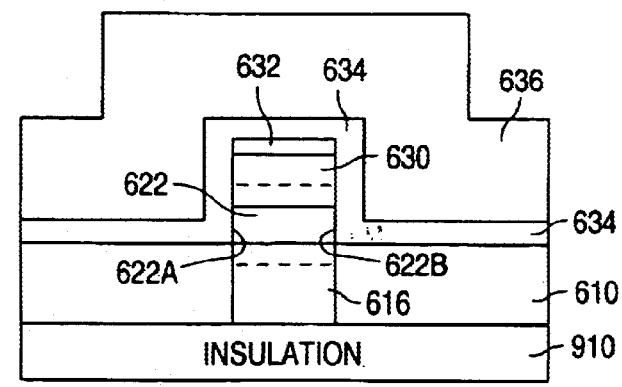
Figure 9H:
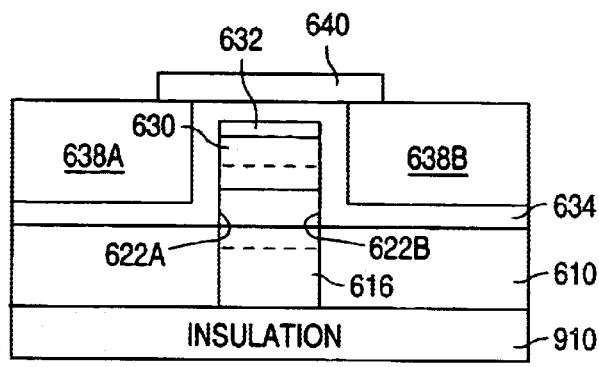
Figure 9I:
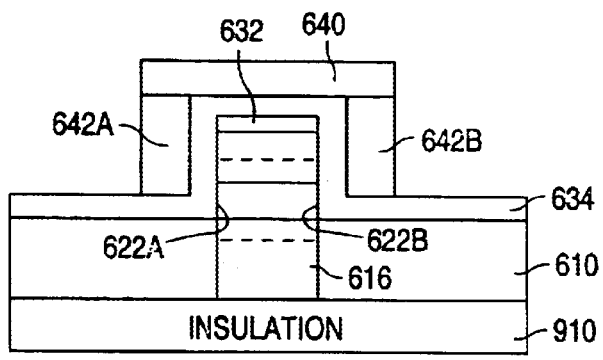
Figure 9J:
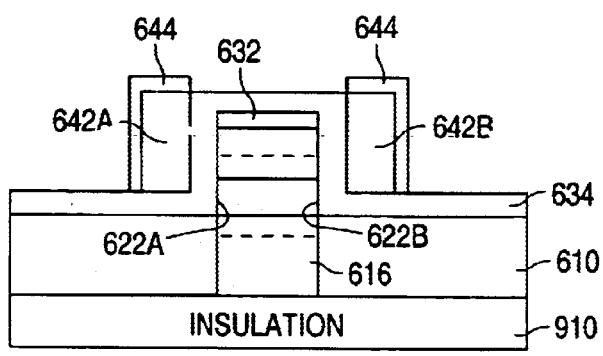
Figure 9K:
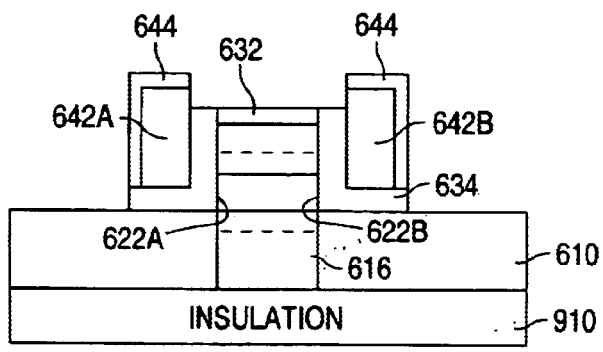
Figure 9L:
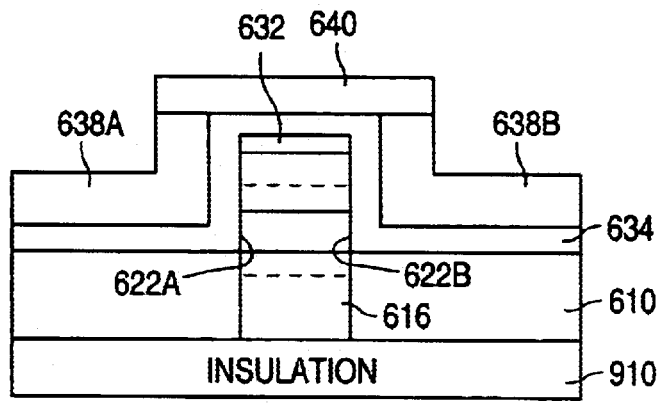
Figure 9M:
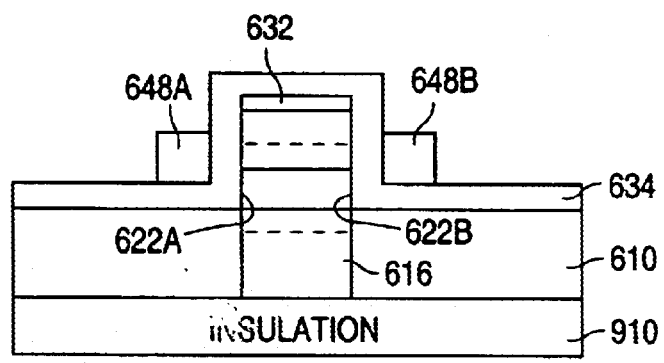
Figure 9N:
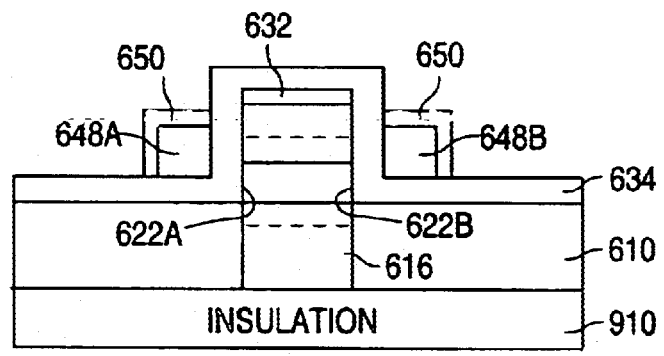
Figure 9O:
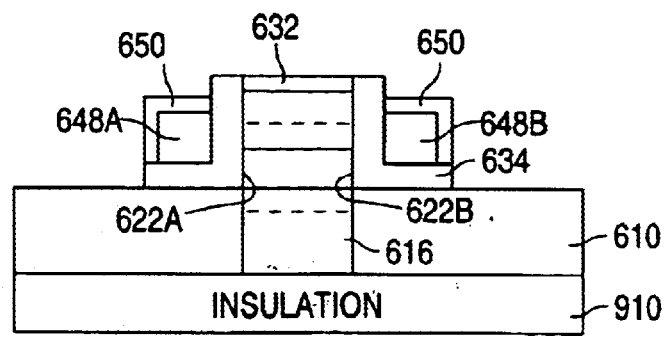

FIGS. 9A–9O show a series of cross-sectional views that illustrate a method of forming a vertical MOS transistor in accordance with an alternate embodiment of the present invention. The method shown in FIGS. 9A–9O is similar to the method shown in FIGS. 6A2, 6B2, 6C2, and 6D–6O and, as a result, utilizes the same reference numerals to designate the steps and structures which are common to both methods.

As shown, the method in FIGS. 9A–9O differs from the method shown in FIGS. 6A2, 6B2, 6C2, and 6D–6O in that the method shown in FIGS. 9A–9O forms material 610 on a layer of insulation material 910, such as the insulation layer of a silicon-on-insulator (SOI) material, and region 616 is formed to contact insulation layer 910. (Region 616 need not contact layer 910.)

Figure 10:
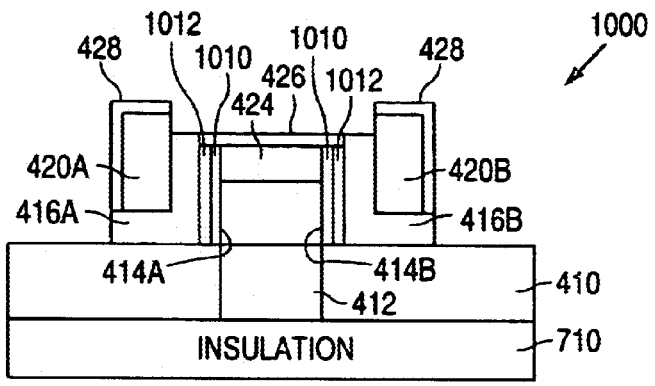
FIG. 10 is a cross-sectional view illustrating a vertical MOS transistor 1000 in accordance with an alternate embodiment of the present invention.

FIG. 10 shows a cross-sectional view that illustrates a vertical MOS transistor 1000 in accordance with an alternate embodiment of the present invention. FIG. 10 can be taken along the line 4B—4B shown in FIG. 4A. MOS transistor 1000 is similar to MOS transistor 700 and, as a result, utilizes the same reference numerals to designate the structures which are common to both transistors.

As shown in FIG. 10, transistor 1000 differs from transistor 700 in that transistor 1000 includes a layer of silicon germanium 1010 that is formed on side walls 414A and 414B (silicon germanium is also formed on the two side walls that can not be seen in cross section), and a layer of strained silicon 1012 that is formed on silicon germanium layer 1010. Gate insulators 416A and 416B are then formed to contact silicon layer 1012.

Figure 11:
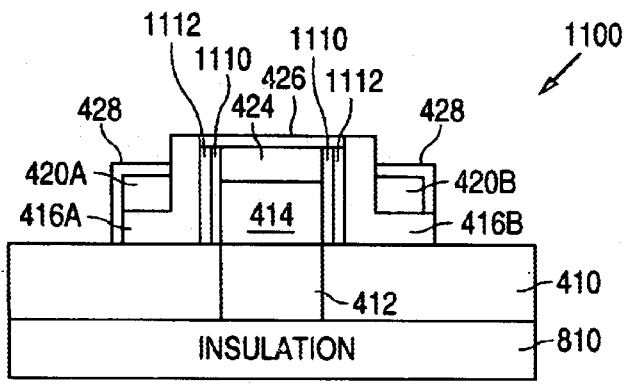
FIG. 11 is a cross-sectional view illustrating a vertical MOS transistor 1100 in accordance with an alternate embodiment of the present invention.

FIG. 11 shows a cross-sectional view that illustrates a vertical MOS transistor 1100 in accordance with an alternate embodiment of the present invention. FIG. 11 can be taken along the line 4B—4B shown in FIG. 4A. MOS transistor 1100 is similar to MOS transistor 800 and, as a result, utilizes the same reference numerals to designate the structures which are common to both transistors.

As shown in FIG. 11, transistor 1100 differs from transistor 800 in that transistor 1100 includes a layer of silicon germanium 1110 that is formed on side walls 414A and 414B (silicon germanium is also formed on the two side walls that can not be seen in cross section), and a layer of strained silicon 1112 that is formed on silicon germanium layer 1110. Gate insulators 416A and 416B are then formed to contact silicon layer 1112.

Figure 12A:
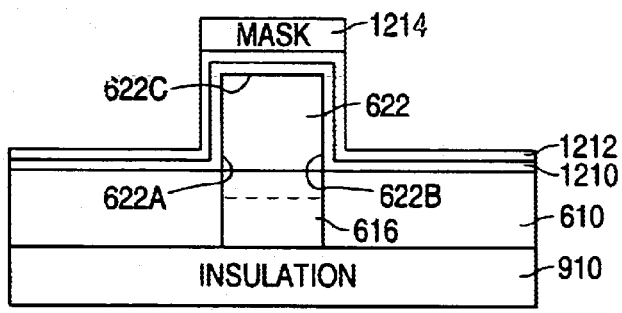
FIGS. 12A–12M are a series of cross-sectional views illustrating a method of forming a vertical MOS transistor in accordance with an alternate embodiment of the present invention.

FIGS. 12A–12M show a series of cross-sectional views that illustrate a method of forming a vertical MOS transistor in accordance with an alternate embodiment of the present invention. The method follows the same steps as shown in FIGS. 9A–9C, and then begins as shown in FIG. 12A by forming a layer of silicon germanium 1210 on material 610 and region 622. Following this, a layer of strained silicon 1212 is formed on silicon germanium layer 1210. Next, a mask 1214 is formed and patterned on silicon layer 1212 to protect the vertical sections of silicon layer 1212.

Figure 12B:
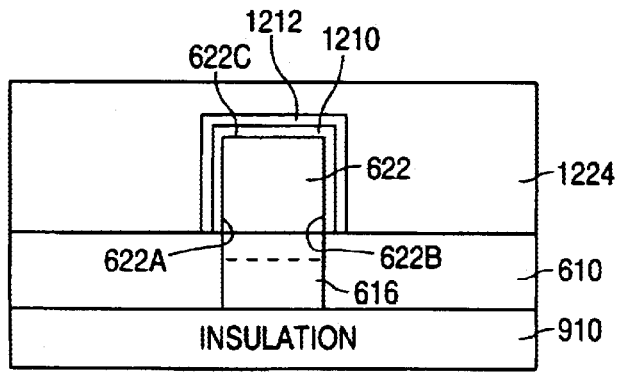

As shown in FIG. 12B, after mask 1214 has been formed and patterned, the exposed regions of strained silicon layer 1212 and the underlying regions of silicon germanium layer 1210 are etched away. Mask 1214 is then removed. (Alternately, rather than using mask 1214, silicon layer 1212 and silicon germanium layer 1210 can be anisotropically etched to form silicon/silicon germanium side wall spacers.) Once mask 1214 has been removed, a layer of sacrificial material 1224, such as oxide, is formed over semiconductor material 610 and silicon layer 1212.

Figure 12C:
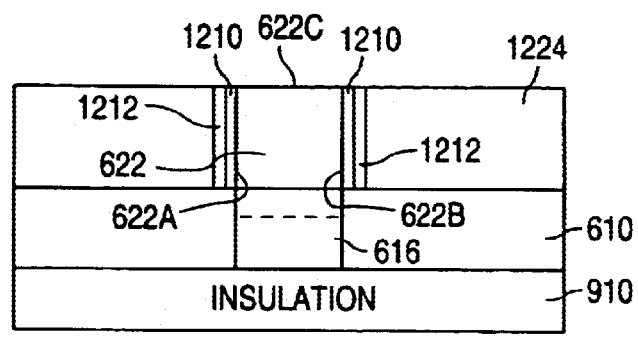

Following this, as shown in FIG. 12C, sacrificial layer 1224 is planarized until silicon germanium layer 1210 has been removed from the top surface 622C of semiconductor region 622. (Alternately, the planarization can stop after sacrificial layer 1224 has been removed from top surface 622C, leaving silicon layer 1212.) Layer 1224 can be planarized using, for example, chemical-mechanical polishing.

Figure 12D:
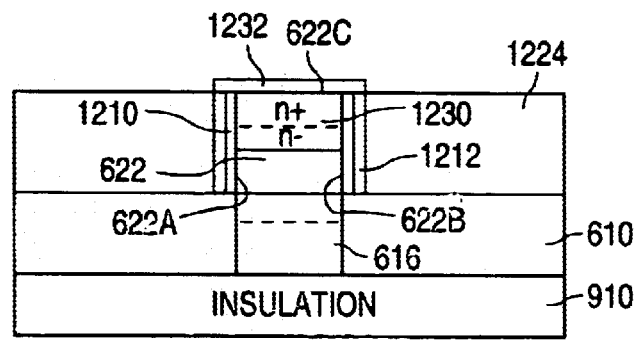

Following this, as shown in FIG. 12D, the top surface 622C of semiconductor region 622 is implanted with an n-type material to form an n-type region 1230 in semiconductor region 622. Region 1230, which can function as, for example, a source or a drain, can be formed as a single heavily-doped n+ region, or as a heavily-doped n+ surface region that contacts a lightly-doped n– lower region as shown in FIG. 12D.

In an alternate embodiment, n-type region 616 can be formed after the planarization step that removes silicon germanium layer 1210 from the top surface 622C of semiconductor region 622. In addition, n-type regions 616 and 1230 can be formed sequentially by utilizing multiple implants with different implant energies.

After implanted region 1230 has been formed, a layer of silicide 1232 is formed on the top surface 622C of region 622. Silicide layer 1232 can be formed using standard materials and methods. After suicide layer 1232 has been formed, sacrificial layer 1224 is removed from the surface of semiconductor material 610.

Figure 12E:
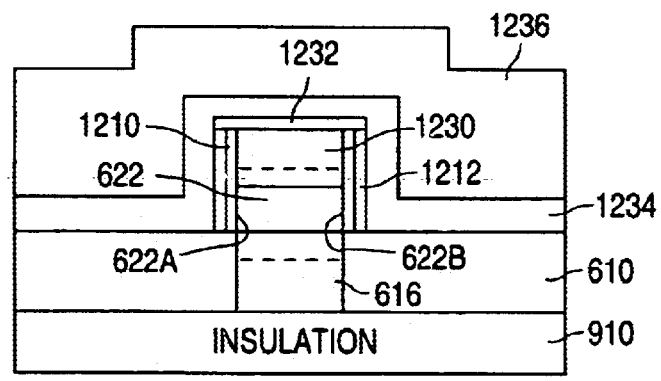
Figure 12F:
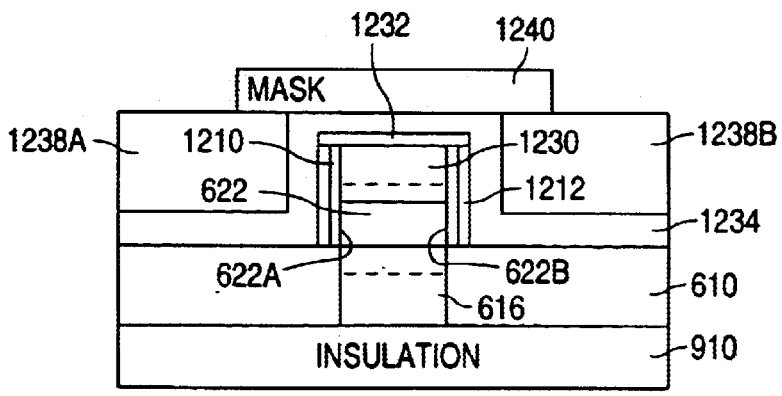

Next, as shown in FIG. 12E, a layer of dielectric material 1234 is formed on the top surface of semiconductor material 610, silicon layer 1212, and silicide layer 1232. (Dielectric layer 1234 is also formed on the two side walls that can not be seen in cross section.) Dielectric layer 1234 can be implemented with gate oxide, nitride, oxide-nitride combinations, and other similar materials. Following this, a layer of conductive material 1236, such as polysilicon, is formed on dielectric layer 1234. When formed from polysilicon, layer 1236 can be doped during or after formation.

After conductive layer 1236 has been formed, as shown in 12F, conductive layer 1236 is planarized until conductive layer 1236 has been removed from the region of dielectric layer 1234 that lies over the top surface 622C of semiconductor region 622. The planarization forms a first gate region 1238A on dielectric layer 1234, and a second gate region 1238B on dielectric layer 1234 on the other side of region 622. (As shown in FIG. 4A, the gates are electrically isolated, but can alternately be connected together.)

Figure 12G:
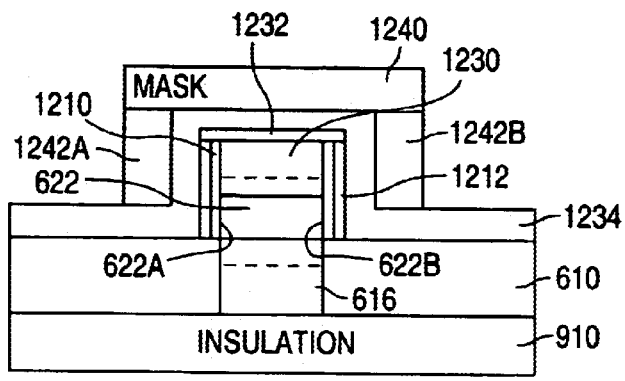

Next, a mask 1240 is formed and patterned over n-type region 1230, the vertical portions of silicon germanium layer 1210, silicon layer 1212, and dielectric layer 1234, and adjacent portions of gate regions 1238A and 1238B. Following this, as shown in FIG. 12G, the exposed areas of gate regions 1238A and 1238B are removed to form side gates 1242A and 1242B. Mask 1240 is then removed.

Figure 12H:
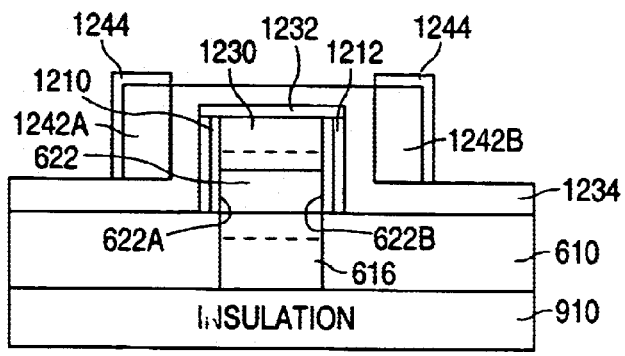
Figure 12I:
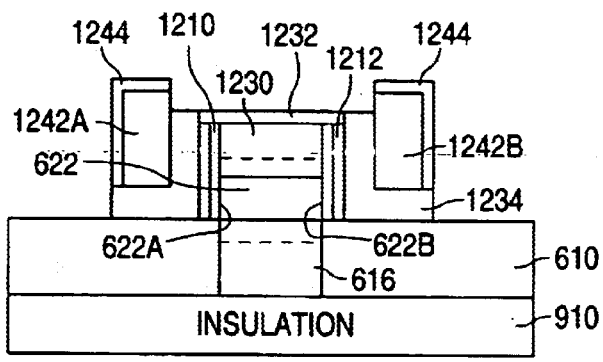

As shown in FIG. 12H, after mask 1240 has been removed, a layer of suicide 1244 is formed on the exposed portions of side gates 1242A and 1242B. Following this, as shown in FIG. 12I, dielectric layer 1234 is etched until dielectric layer 1234 has been removed from the surface of silicide layer 1232. The method then continues with conventional backend processing steps.

Figure 12J:
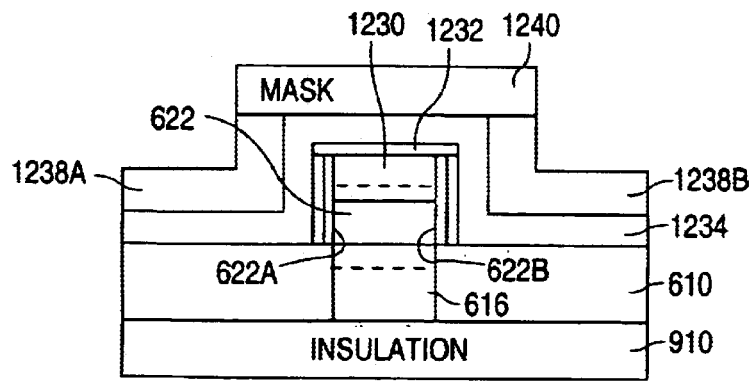
Figure 12K:
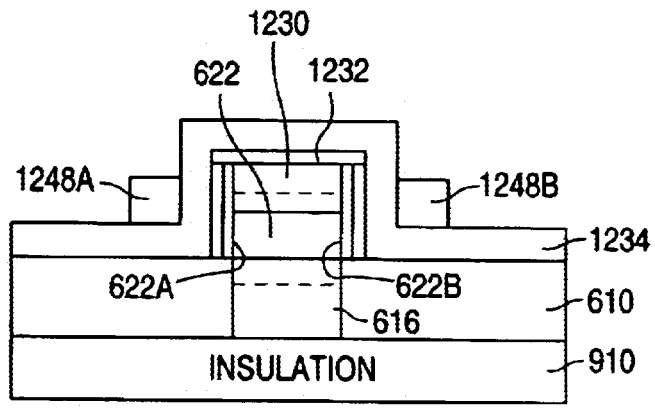

In another alternate embodiment, as shown in FIG. 12J, the exposed areas of gate regions 1238A and 1238B are partially removed after mask 1240 has been formed. After this, mask 1240 is removed. Next, as shown in FIG. 12K, gate regions 1238A and 1238B are further etched to form side gates 1248A and 1248B.

Figure 12L:
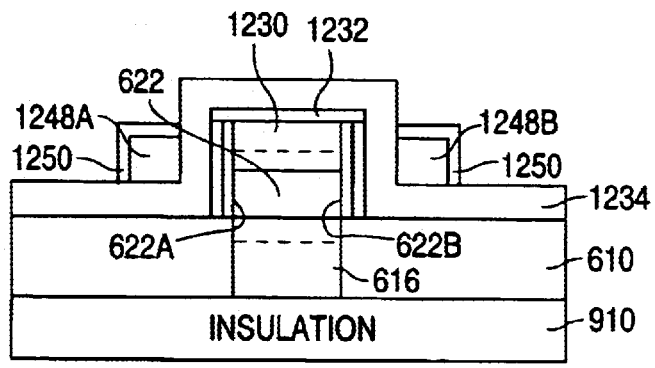
Figure 12M:
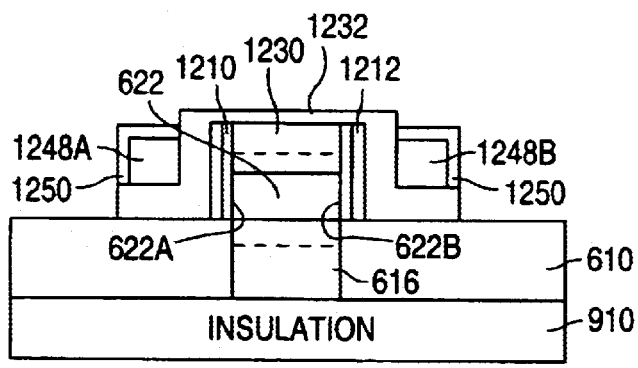

After this, as shown in FIG. 12L, a layer of suicide 1250 is formed on the exposed portions of side gates 1248A and 1248B. Following this, as shown in FIG. 12M, dielectric layer 1234 is etched until dielectric layer 1234 has been removed from the surface of silicide layer 1232. The method then continues with conventional backend processing steps.

It should be understood that the above descriptions are examples of the present invention, and that various alternatives of the invention described herein may be employed in practicing the invention. For example, although the present invention has been described in terms of NMOS transistors, the present invention applies equally to PMOS transistors.

Thus, it is intended that the following claims define the scope of the invention and that structures and methods within the scope of these claims and their equivalents be covered thereby.

What is claimed is:

1. A MOS transistor formed in a semiconductor material of a first conductivity type, the transistor comprising:

a first region of a second conductivity type formed in the semiconductor material;

a semiconductor region of the first conductivity type formed on the semiconductor material over the first region, the semiconductor region having a first side wall, an opposite second side wall, and a top surface;

an insulator formed on the semiconductor material to contact the first side wall;

a conductor formed on the first insulator such that the conductor is separated from the first side wall by the insulator, no portion of the conductor lying vertically over the first region; and a second region of the second conductivity type formed in the top surface of the semiconductor region;

and further wherein the first region has a substantially non-uniform dopant concentration and includes:

a surface region of a light dopant concentration;

and a lower region of a heavy dopant concentration that lies below and contacts the surface region.

2. The MOS transistor of claim 1 wherein the first region has a substantially uniform dopant concentration.

3. The MOS transistor of claim 1 wherein the semiconductor region includes:

a layer of silicon germanium; and a layer of silicon formed on the layer of silicon germanium, the layer of silicon lying laterally between the conductor and the layer of silicon germanium.

4. The MOS transistor of claim 1 wherein the semiconductor material is formed on a layer of insulation material, the first region contacting the layer of insulation material.

5. A semiconductor device formed in a semiconductor material, the semiconductor material having first and second portions of a first conductivity type, the semiconductor device comprising:

a first region of a second conductivity type formed in the semiconductor material, the first region having a side surface with a plurality of points that contact the first portion of the semiconductor material and a bottom surface that contacts the second portion of the semiconductor material, the first and second portions having substantially equal dopant concentrations;

an insulator that contacts the first portion of the semiconductor material;

a conductor formed on the insulator vertically over the first portion of the semiconductor material; and a semiconductor region of the first conductivity type formed on the semiconductor material vertically over the first region, the semiconductor region having a first side wall and a top surface.

6. The semiconductor device of claim 5 and further comprising a second region of the second conductivity type formed in the top surface of the semiconductor region.

7. The semiconductor device of claim 5 wherein the insulator lies laterally between the conductor and the semiconductor region, and a thickness of the insulator between the conductor and the semiconductor material is substantially equal to a thickness of the insulator between the conductor and the semiconductor region.

8. The semiconductor device of claim 5 wherein the semiconductor material is formed on a layer of insulation material, the first region contacting the layer of insulation material.

9. The semiconductor device of claim 5 wherein the semiconductor region includes:
a layer of silicon germanium; and
a layer of silicon formed on the layer of silicon germanium, the layer of silicon lying laterally between the conductor and the layer of silicon germanium.

10. The semiconductor device of claim 5 wherein the first region has a substantially non-uniform dopant concentration, and includes:
a top region of a light dopant concentration; and
a bottom region of a heavy dopant concentration that lies vertically below and contacts the top region.

11. A semiconductor device comprising:
a first region of a first conductivity type;
a second region of a second conductivity type formed in the first region, the second region having:
a upper region of a light dopant concentration, the upper region having bottom surface, the bottom surface having a plurality of spaced-apart points; and
a lower region of a heavy dopant concentration that lies below and contacts the plurality of spaced-apart points on the bottom surface of the upper region;
a third region of the first conductivity type that contacts the second region, the third region having a first side wall, an opposite second side wall, and a top surface;
an insulator formed on the semiconductor material adjacent to the first side wall;
a conductive region formed on the insulator such that the insulator lies laterally between the conductive region and the first side wall; and
a fourth region of the second conductivity type that contacts the top surface of the third region.

12. The semiconductor device of claim 11 wherein the first region is formed on a layer of isolation material, the second region contacting the layer of isolation material.

13. The semiconductor device of claim 11 wherein the third region includes:
a layer of silicon germanium; and
a layer of silicon formed on the layer of silicon germanium, the layer of silicon lying laterally between the conductive material and the layer of silicon germanium.

14. The semiconductor device of claim 11 and further comprising a conductor formed over the first region, the conductor being laterally spaced apart from the second side wall by a non-conductive material.

15. The semiconductor device of claim 1 and further comprising a conductive region formed over the semiconductor material, the conductive region being laterally spaced apart from the second side wall by a non-conductive material.

* * * * *

UNITED STATES PATENT AND TRADEMARK OFFICE
CERTIFICATE OF CORRECTION

PATENT NO. : 6,777,288 B1
DATED : August 17, 2004
INVENTOR(S) : Padmanabhan et al.

It is certified that error appears in the above-identified patent and that said Letters Patent is hereby corrected as shown below:

Column 4,
Line 25, delete "422" and replace with -- 422A --.

Column 7,
Line 18, delete "60" and replace with -- 6O --.
Line 20, delete "suicide" and replace with -- silicide --.

Column 9,
Lines 12, 43 and 55, delete "suicide" and replace with -- silicide --.

Column 10,
Line 16, delete "first".

Column 11,
Line 23, after "having" insert -- a --.

Signed and Sealed this

Eighth Day of February, 2005

JON W. DUDAS
*Director of the United States Patent and Trademark Office*